United States Patent
Ting et al.

(10) Patent No.: US 12,374,560 B2
(45) Date of Patent: Jul. 29, 2025

(54) METHOD FOR MANUFACTURING ELECTRONIC DEVICE

(71) Applicant: InnoLux Corporation, Miao-Li County (TW)

(72) Inventors: Chin-Lung Ting, Miao-Li County (TW); Cheng-Chi Wang, Miao-Li County (TW); Yu-Jen Chang, Miao-Li County (TW); Ju-Li Wang, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 92 days.

(21) Appl. No.: 17/969,703

(22) Filed: Oct. 20, 2022

(65) Prior Publication Data

US 2024/0038550 A1    Feb. 1, 2024

(30) Foreign Application Priority Data

Jul. 29, 2022    (CN) .......................... 202210907191.4

(51) Int. Cl.
*H01L 21/48*    (2006.01)
*C23C 14/34*    (2006.01)
(Continued)

(52) U.S. Cl.
CPC ............ *H01L 21/486* (2013.01); *C23C 14/34* (2013.01); *C23C 14/5873* (2013.01); *C23C 28/023* (2013.01); *C23C 28/322* (2013.01); *C25D 7/123* (2013.01); *H01L 23/49827* (2013.01); *H01L 23/49838* (2013.01); *H01L 24/11* (2013.01); *H01L 24/13* (2013.01); *H01L 21/6835* (2013.01); *H01L 24/16* (2013.01); *H01L 24/32* (2013.01); *H01L 24/73* (2013.01); *H01L 2221/68345* (2013.01);
(Continued)

(58) Field of Classification Search
None
See application file for complete search history.

(56) References Cited

U.S. PATENT DOCUMENTS 6,071,814 A * 6/2000 Jang ....................... C25D 7/123
                                                               438/654
7,857,958 B2   12/2010 McHugh
(Continued)

FOREIGN PATENT DOCUMENTS

| CN | 1847464   | 10/2006 |
| CN | 100416777 | 9/2008  |

(Continued)

OTHER PUBLICATIONS

Fredenberg (https://www.comsol.com/blogs/author/mikael-fredenberg/). (Year: 2014).*

*Primary Examiner* — Wojciech Haske
(74) *Attorney, Agent, or Firm* — Winston Hsu

(57) ABSTRACT

The present disclosure discloses a manufacturing method of an electronic device. A seed layer is formed on a substrate. After patterning the seed layer to form a plurality of sub-seed layers and a plurality of conductive lines, a metal layer is formed on a plurality of the sub-seed layers. The sub-seed layers include a first sub-seed layer and a second sub-seed layer, and the first sub-seed layer and the second sub-seed layer are separated from each other.

16 Claims, 9 Drawing Sheets

(51) Int. Cl.
   *C23C 14/58*    (2006.01)
   *C23C 28/00*    (2006.01)
   *C23C 28/02*    (2006.01)
   *C25D 7/12*     (2006.01)
   *H01L 23/00*    (2006.01)
   *H01L 23/498*   (2006.01)
   *H01L 21/683*   (2006.01)

(52) U.S. Cl.
   CPC ............... *H01L 2224/11462* (2013.01); *H01L 2224/13005* (2013.01); *H01L 2224/13021* (2013.01); *H01L 2224/13082* (2013.01); *H01L 2224/16227* (2013.01); *H01L 2224/16237* (2013.01); *H01L 2224/32225* (2013.01); *H01L 2224/73203* (2013.01)

(56) References Cited

U.S. PATENT DOCUMENTS

| | | |
|---|---|---|
| 2003/0168343 A1 | 9/2003 | Commander |
| 2004/0040855 A1* | 3/2004 | Batinovich ......... H01L 21/2885 |
| | | 205/183 |
| 2006/0226014 A1 | 10/2006 | Chuang |
| 2006/0237325 A1 | 10/2006 | Yang |
| 2009/0139868 A1 | 6/2009 | Shrader |
| 2010/0071940 A1* | 3/2010 | Ejiri ...................... H01L 23/498 |
| | | 174/257 |
| 2011/0284386 A1 | 11/2011 | Willey |
| 2012/0139112 A1 | 6/2012 | Bchir |
| 2018/0366407 A1* | 12/2018 | Ooi ..................... H01L 23/5389 |

FOREIGN PATENT DOCUMENTS

| | | |
|---|---|---|
| CN | 101452973 A | 6/2009 |
| CN | 103222350 B | 8/2016 |
| CN | 106245073 | 12/2019 |

\* cited by examiner

METHOD FOR MANUFACTURING ELECTRONIC DEVICE

BACKGROUND OF THE DISCLOSURE

1. Field of the Disclosure

The present disclosure relates to a method for manufacturing an electronic device, in particular to a method for manufacturing an electronic device which is able to improve the electrical reliability of the electronic device.

2. Description of the Prior Art

During the manufacturing process of an electronic device, it is often needed to form a conductive material on a substrate. For example, the conductive material may be formed on the substrate through an electroplating process. During copper electroplating, uneven plating solution, uneven current density or uneven electric field may result in uneven thickness distribution of the electroplated copper layer, to affect the curvature of the substrate or further to affect the reliability of electronic devices.

In view of these, there is a need in the art to continuously research a manufacturing method of electronic devices to improve the uneven thickness of the electroplating layer.

SUMMARY OF THE DISCLOSURE

Some embodiments of the present disclosure provide a method for manufacturing an electronic device. First, a substrate is provided. Then, a seed layer is formed on the substrate. Next, the seed layer is patterned to form a plurality of sub-seed layers and a plurality of conductive lines. Thereafter, a metal layer is formed on at least one of the sub-seed layers. The sub-seed layers include a first sub-seed layer and a second sub-seed layer, and the first sub-seed layer and the second sub-seed layer are separated from each other.

These and other objectives of the present disclosure will no doubt become obvious to those of ordinary skill in the art after reading the following detailed description of the embodiment that is illustrated in the various figures and drawings.

DETAILED DESCRIPTION

The present disclosure may be understood by reference to the following detailed description, taken in conjunction with the drawings as described below. For purposes of illustrative clarity understood, various drawings of this disclosure show a portion of the electronic device, and certain elements in various drawings may not be drawn to scale. In addition, the number and dimension of each device shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not in function.

In the following description and in the claims, the terms "include", "comprise" and "have" are used in an open-ended fashion, and thus should be interpreted to mean "include, but not limited to . . . ".

It will be understood that when an element or layer is referred to as being "on another component or on another layer" or "connected to another component or to another layer", it can be directly on or directly connected to the other element or layer, or intervening elements or layers may be presented. In contrast, when an element is referred to as being "directly on" or "directly connected to" another element or layer, there are no intervening elements or layers presented.

In some embodiments of the present disclosure, terms such as "connection", "interconnection", etc. regarding bonding and connection, unless specifically defined, may refer to two structures which are in direct contact with each other, or are not in direct contact with each other. It is possible that there are other structures located between these two structures. Moreover, terms such as "connection", "interconnection" may also include the case where both structures are movable or both structures are fixed. In addition, the terms "electrical connected" or "electrical coupled" includes any direct and indirect electrical connection means.

Although terms such as first, second, third, etc., may be used to describe diverse constituent elements, such constituent elements are not limited by the terms. The terms are used only to discriminate a constituent element from other constituent elements in the specification. The claims may not use the same terms, but instead may use the terms first, second, third, etc. with respect to the order in which an element is claimed. Accordingly, in the following description, a first constituent element may be a second constituent element in a claim.

It should be noted that the technical features in different embodiments described in the following can be replaced, recombined, or mixed with one another to constitute another embodiment without departing from the spirit of the present disclosure.

Figure 1:
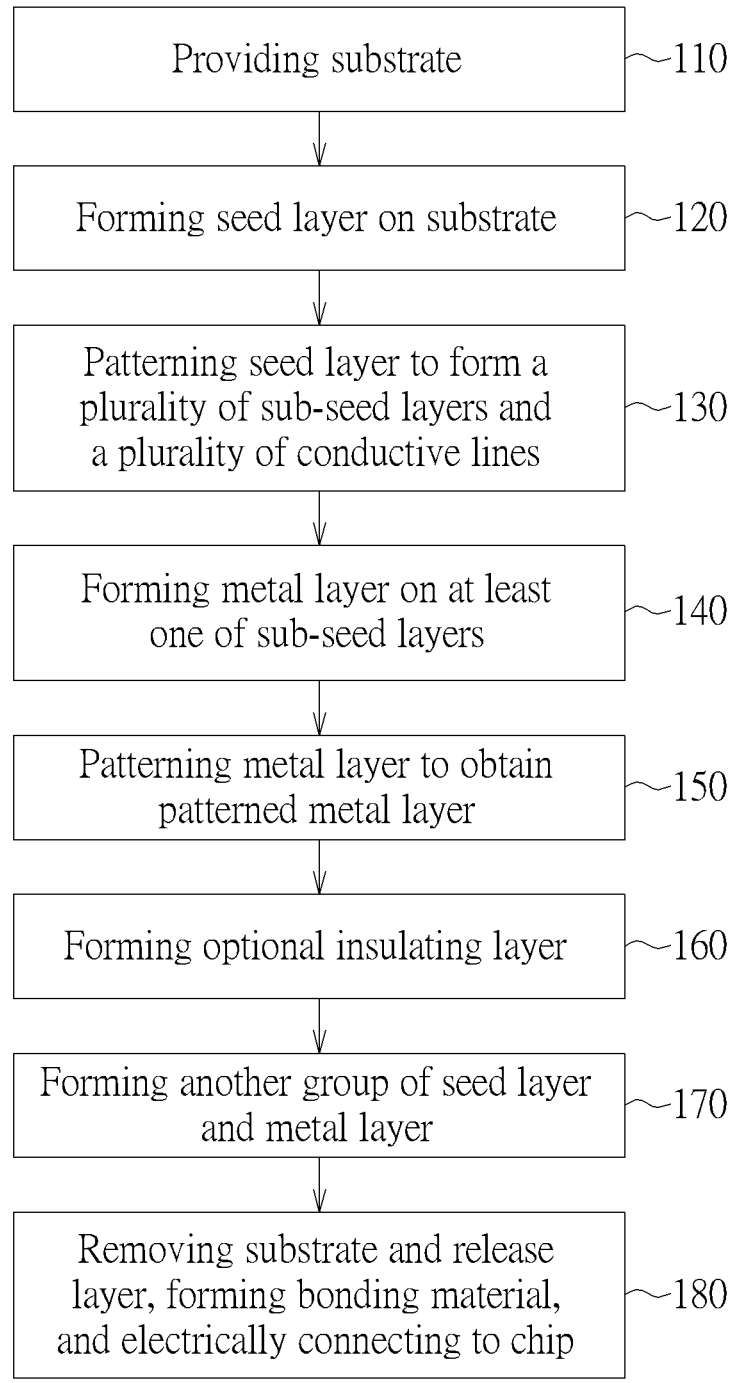
FIG. 1 shows a schematic flowchart of some embodiments according to a method for manufacturing an electronic device of the present disclosure.

FIG. 1 shows a schematic flowchart of some embodiments according to a method for manufacturing an electronic device 100 of the present disclosure. FIG. 2A to FIG. 2E respectively illustrate schematic diagrams of a process for manufacturing an electronic device according to the present disclosure, and schematic cross-sectional views show the device structure. FIG. 2A to FIG. 2E generally correspond to the schematic flowchart shown in FIG. 1. In the present disclosure, the electronic device 100 may include various electronic components, semiconductor package components, display devices, lighting devices, sensing devices, antenna devices, bendable electronic devices, splicing electronic devices, or flexible electronic devices, etc., but the present disclosure is not limited thereto. The electronic device 100 may also include a semiconductor die, or a functional stack formed by alternately stacking multiple metal layers (for example, a copper layer and a seed layer) and multiple insulating layers, such as a redistribution layer (RDL), but the present disclosure is not limited thereto. "Flexible/bendable" here refers to a material which is able to be curved, bent, folded, rolled, flexible, stretched and and/or other similar deformations to represent at least one possible deformation mode described above, and "flexible/bendable" is not limited to the above deformation modes. The antenna device may be a liquid crystal antenna device or a non-liquid crystal antenna device. The sensing device may be a sensing device for sensing capacitance, light, heat or ultrasonic waves, but the present disclosure is not limited thereto. In the present disclosure, an electronic element may include a passive elements or an active element, such as a capacitor, a resistor, an inductor, a diode, a thin film transistor, an electrostatic discharge (ESD) protection element, and the like. The diodes may include a light emitting diode or a photodiode. The light emitting diode may, for example, include an organic light emitting diode (OLED), a sub-millimeter light emitting diode (mini LED), a micro light emitting diode (micro LED), or a quantum dot light emitting diode, but the present disclosure is not limited thereto. The splicing device may be, for example, a display splicing device or an antenna splicing device, but the present disclosure is not limited thereto. It should be noted that, the electronic device of the present disclosure may be any combination of the above, but the present disclosure is not limited thereto.

Figure 2A:
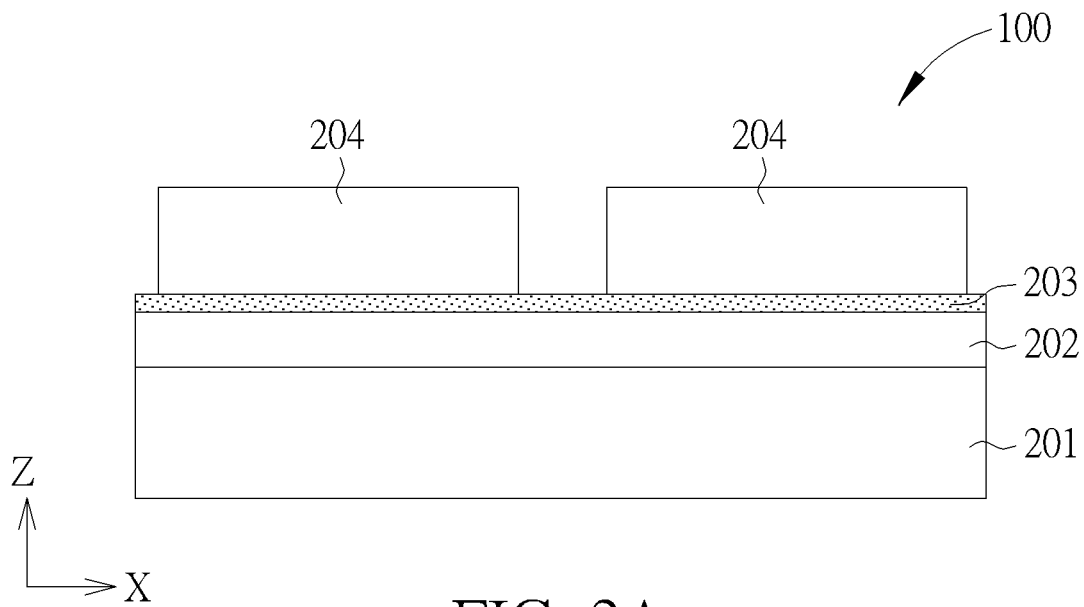
FIG. 2A is a schematic cross-sectional view of the substrate corresponding to the step of FIG. 1 according to a method for manufacturing an electronic device of the present disclosure.

Please refer to FIG. 1 and to FIG. 2A to FIG. 2E; FIG. 2A to FIG. 2E are schematic cross-sectional views according to a method for manufacturing an electronic device 100 of the present disclosure. The Z direction in FIG. 2A is the normal direction of the electronic device 100, or may be regarded as the stacking direction of the multi-layer metal layers and insulating layers in the device, and the X direction is perpendicular to the Z direction. Step 110 in FIG. 1 shows that a substrate 201 is first provided. The substrate 201 may be a carrier of supporting properties for supporting the combinations of one or more electronic units, release layers, insulating layers, material layers, and/or circuit layers. For example, in some embodiments, the substrate 201 may include an organic material, an inorganic material, or a combination of the above, such as silicon, plastic, or glass, and other materials in need of electroplating metal layers, but the present disclosure is not limited thereto. According to some embodiments, the substrate 201 may be a tempo-rarily supporting carrier plate. According to some embodiments of the present disclosure, at least a release layer 202 may be stacked on the substrate 201, but the present disclosure is not limited thereto. The release layer 202 may be a temporary adhesive layer so that components such as multiple electronic units, insulating layers, material layers and/or circuit layers may be temporarily attached to the substrate 201, and the substrate 201 may be separated from the above components when necessary. The release layer 202 may include any suitable adhesive material. In some embodiments, when the substrate 201 needs to be separated from the above-mentioned components, the release layer 202 may be processed by, for example, thermal cracking, laser removal or other suitable methods, so that the substrate 201 may be separated from the above-mentioned components, but the present disclosure is not limited thereto. In this embodiment, the release layer 202 may be an entire piece to be formed on the surface of the substrate 201.

Next, step 120 in FIG. 1 shows that a seed layer 203 is provided on the substrate 201. For example, an entire piece of the seed layer 203 may be formed on the substrate 201, so that the subsequent conductive materials may be formed on the substrate 201. The seed layer 203 may be a stack of single layer or a multi-layer inorganic material. The material of the seed layer 203 may include a conductive material, such as titanium, copper, aluminum, zinc, platinum, a combination of the above, an oxides and/or an alloy thereof, or other suitable materials, but the present disclosure is not limited thereto. The seed layer 203 may be formed by sputtering, electro-plating, for example, but the present disclosure is not limited thereto. In some embodiments, an optional insulating layer (not shown) may be disposed between the seed layer 203 and the release layer 202, but the present disclosure is not limited thereto.

Next, step 130 of FIG. 1 is performed to pattern the seed layer 203 to form a patterned seed layer including a plurality of specific patterns. In some embodiments, a photoresist layer 204 may be formed on the seed layer 203 so that the release layer 202 may be disposed between the seed layer 203 and the substrate 201, and the seed layer 203 may be disposed between the release layer 202 and the photoresist between layers 204, but the present disclosure is not limited thereto. The photoresist layer 204 may include a positive type photoresist or a negative type photoresist, and a positive type photoresist is used as an example for illustration only, but the present disclosure is not limited thereto. The photoresist layer 204 may be firstly formed on the entire surface of the seed layer 203, and a part of the photoresist layer 204 may be removed by a patterning process to pattern the photoresist layer 204, to cover a part of the seed layer 203 and expose the other part of the seed layer 203, as shown in FIG. 2A. The method of patterning the photoresist layer 204 may be, for example, a lithographic etching process, but the present disclosure is not limited thereto. The patterned photoresist layer 204 may be used to define a predetermined pattern of the seed layer 203, for example, the pattern may correspond to a predetermined pattern design of a plurality of sub-seed layers and a plurality of conductive lines. Next, the patterned photoresist layer 204 may be used as a mask to remove a part of the seed layer 203 to carry out the step of patterning the seed layer 203 to form a patterned seed layer 203' including a plurality of sub-seed layers and a plurality of conductive line patterns. For example, in some embodiments, in the presence of the patterned photoresist layer 204, the seed layer 203 which is not covered by the patterned photoresist layer 204 may be removed by etching to obtain the patterned seed layer 203' (as shown in FIG.

2B), which may expose a part of the release layer 202. After the etching step is completed, the patterned photoresist layer 204 may be removed, to leave the patterned seed layer 203'.

Figure 2B:
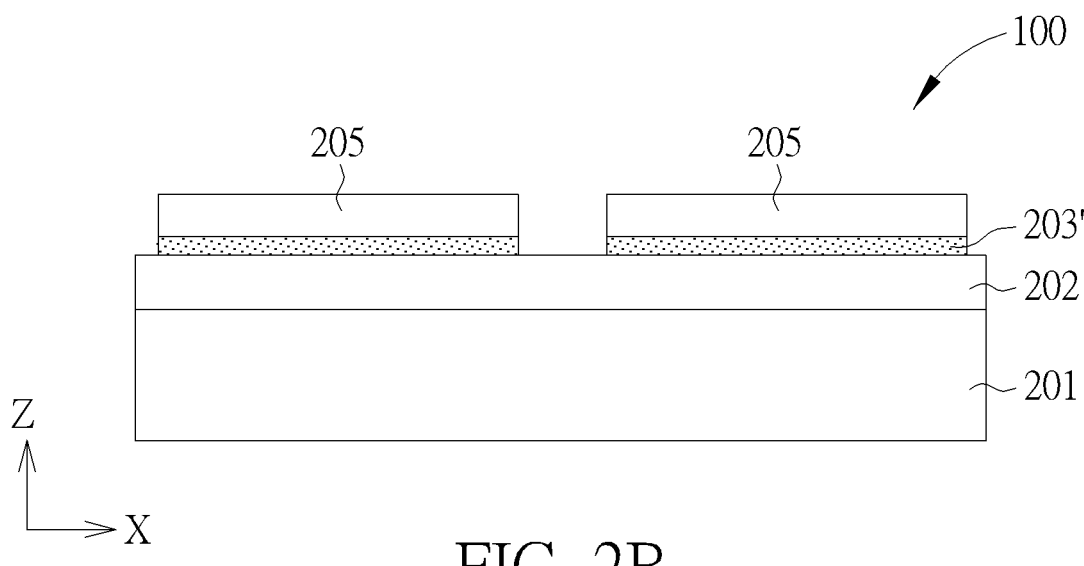
FIG. 2B is a schematic cross-sectional view of the substrate corresponding to the step of FIG. 1 according to a method for manufacturing an electronic device of the present disclosure.
Figure 2C:
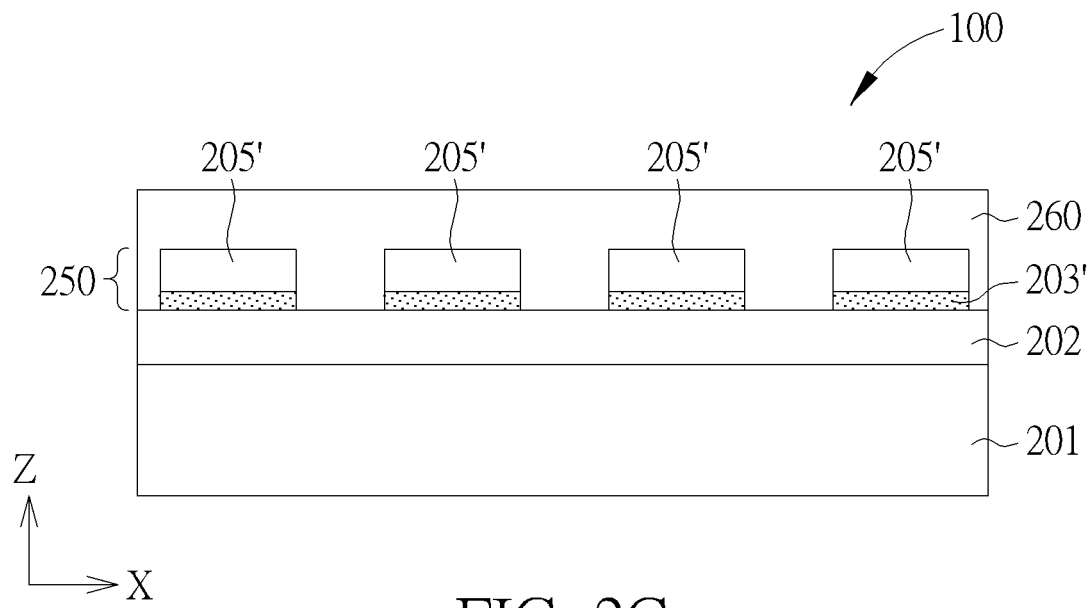
FIG. 2C is a schematic cross-sectional view of the substrate corresponding to the step of FIG. 1 according to a method for manufacturing an electronic device of the present disclosure.
Figure 2D:
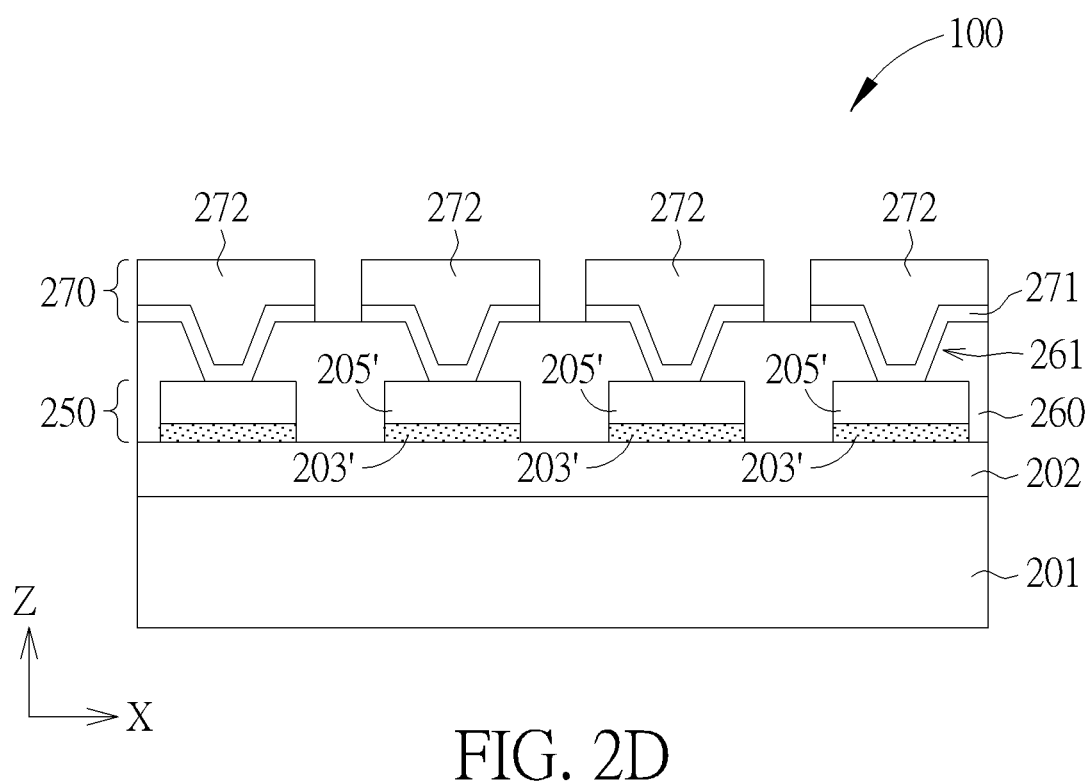
FIG. 2D is a schematic cross-sectional view of the substrate corresponding to the step of FIG. 1 according to a method for manufacturing an electronic device of the present disclosure.
Figure 2E:
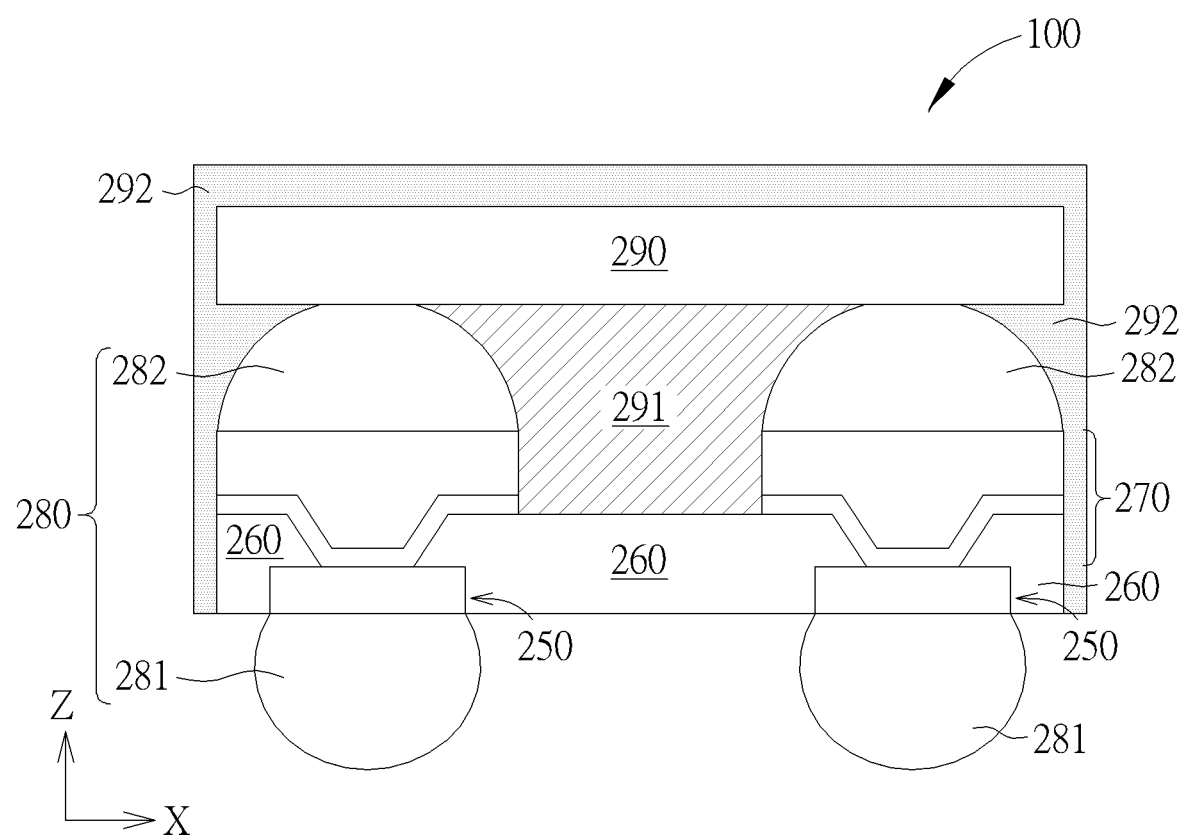
FIG. 2E is a schematic cross-sectional view of the substrate corresponding to the step of FIG. 1 according to a method for manufacturing an electronic device of the present disclosure.
Figure 3:
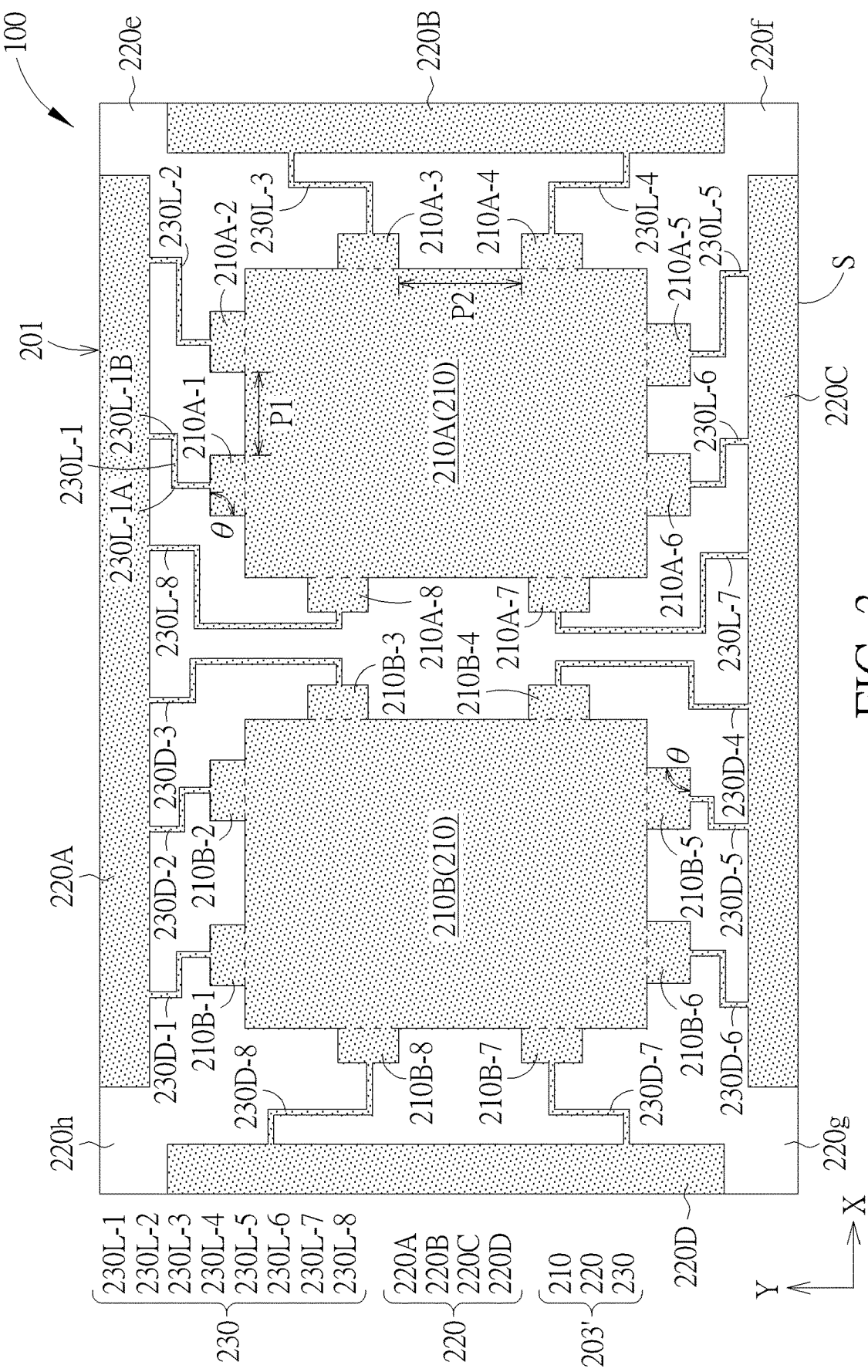
FIG. 3, FIG. 3A and FIG. 3B are respective schematic top views of the substrate corresponding to FIG. 2A after removing the patterned photoresist layer and leaving the patterned seed layer on the substrate according to a method for manufacturing an electronic device of the present disclosure.
Figure 3A:
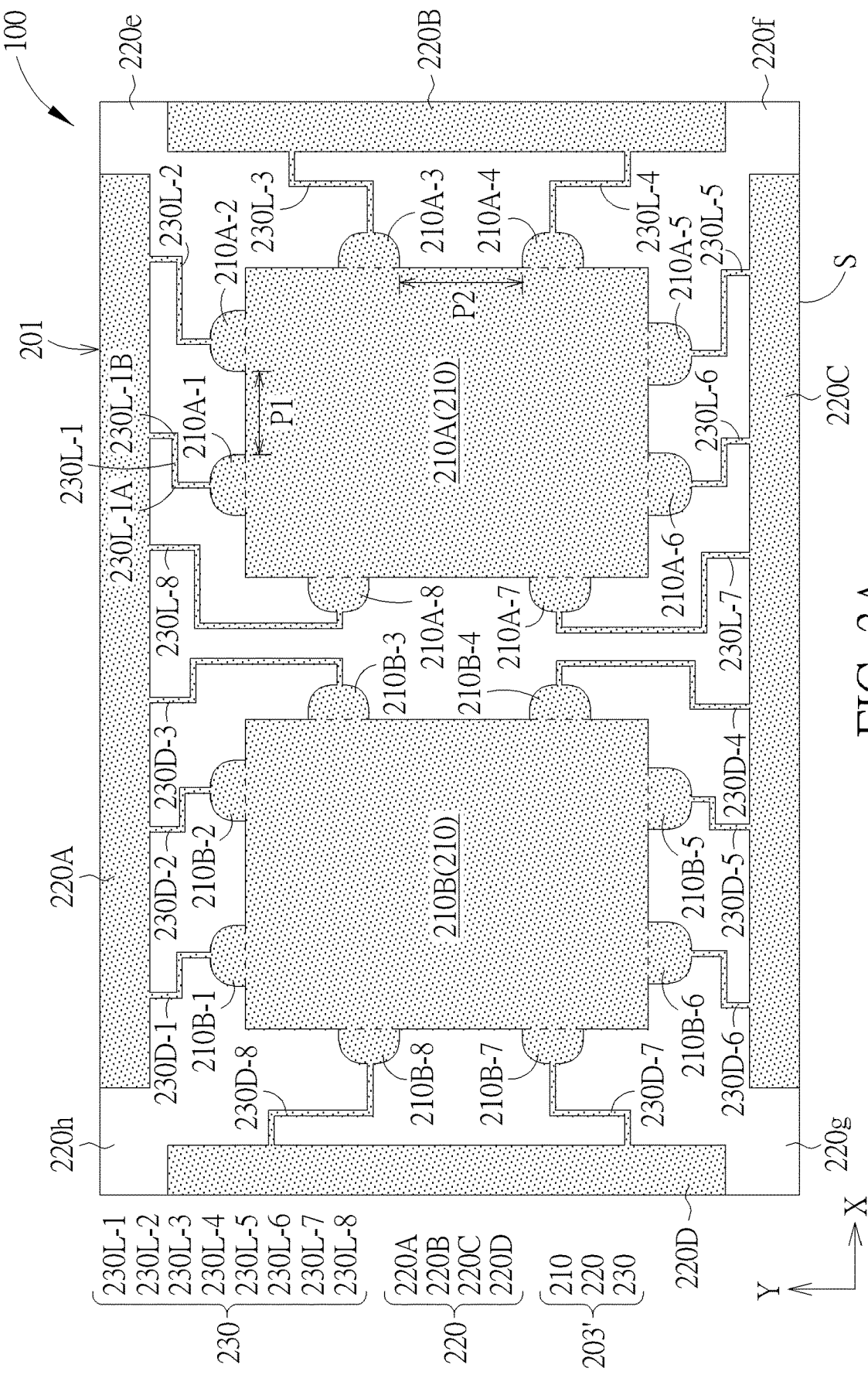
Figure 3B:
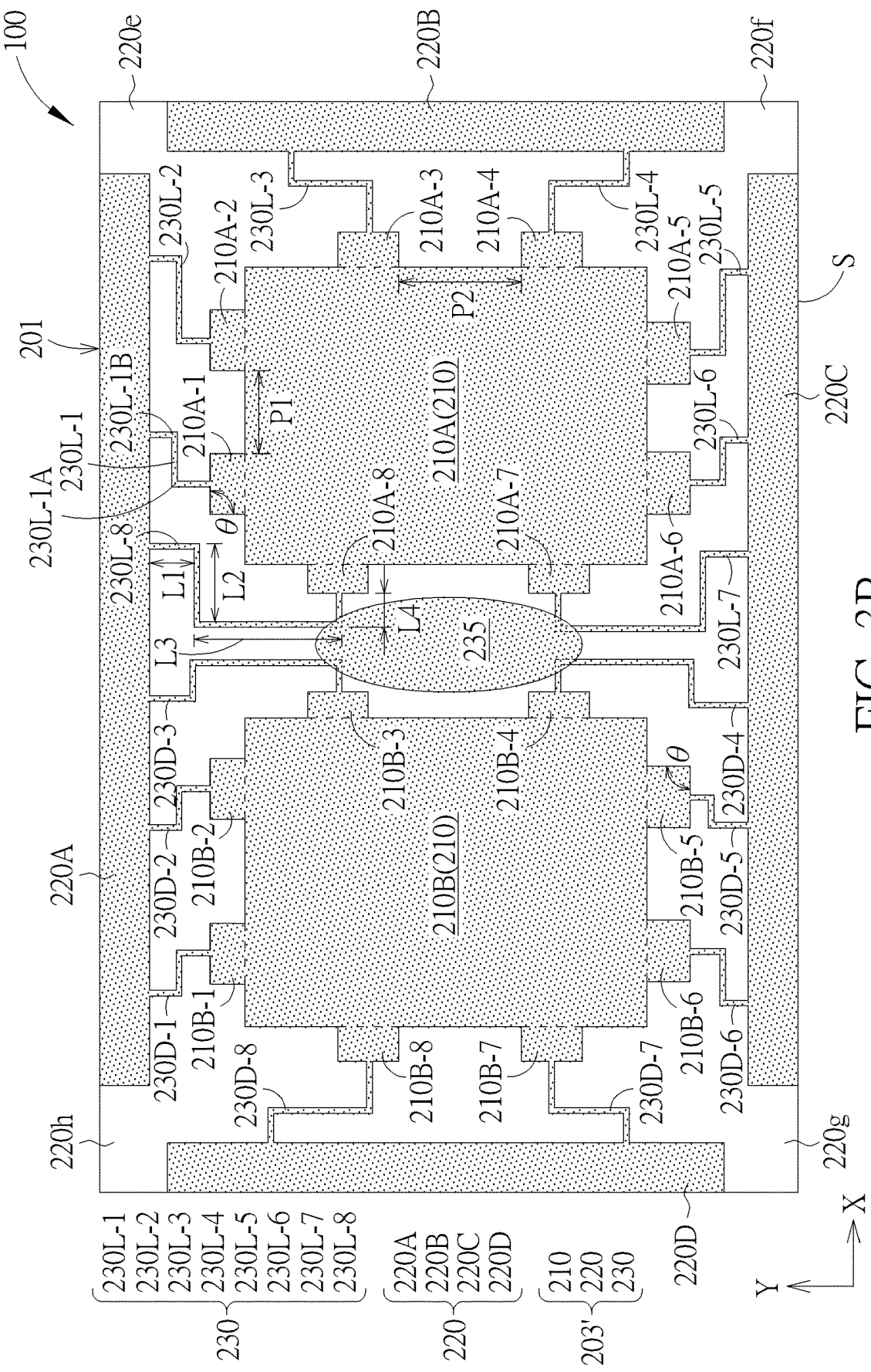

Please continue to refer to FIG. 2A to FIG. 2E and to FIG. 3, to FIG. 3A and to FIG. 3B. FIG. 3 and FIG. 3B respectively illustrate schematic views of the method for manufacturing the electronic device 100 according to the present disclosure corresponding to the two embodiments of removed patterned photoresist layer 204 and leaving the patterned seed layer 203' on the substrate 201 in FIG. 2A. The X direction is perpendicular to the Y direction, and the X direction as well as the Y direction are respectively perpendicular to the Z direction shown in FIG. 2A. Forming the patterned seed layer 203' on the substrate 201 may include forming a plurality of sub-seed layers and a plurality of conductive lines. For example, please refer to FIG. 3, to FIG. 3A and to FIG. 3B, in the top view (Z direction), the patterned seed layer 203' may have various shapes, such as rectangle, circle, square, triangle, line, a combination of the above or other suitable shapes, but the present disclosure is not limited thereto. In other words, the patterned seed layer 203' may include at least a first sub-seed layer 210 and a second sub-seed layer 220 and a plurality of conductive lines 230, but the present disclosure is not limited thereto. According to some embodiments of the present disclosure, the first sub-seed layer 210 and the second sub-seed layer 220 may be disposed to be separated from each other. For example, the term "disposed to be separated from each other" may be regarded as the first sub-seed layer 210 and the second sub-seed layer 220 to be physically separated from each other without being physically connected, or may be regarded as separated from each other by an appropriate distance, but the present disclosure is not limited thereto.

According to some embodiments of the present disclosure, the first sub-seed layer 210 may include at least one main region and at least one protrusion, for example, may include one or more main regions and one or more protrusions. For instance, a main region may be a region which is used for forming one or more useful electronic devices, and the first sub-seed layer 210 may include only one main region in some embodiments. Alternatively, as shown in FIG. 3, the first sub-seed layer 210 may include an embodiment of two main regions (i.e., the main region 210A and the main region 210B), but the first sub-seed layer 210 of the present disclosure is not limited to two main regions, and may also include embodiments with more than two main regions. According to some embodiments of the present disclosure, the second sub-seed layer 220 may include a plurality of peripheral regions, such as a peripheral region 220A, a peripheral region 220B, a peripheral region 220C and a peripheral region 220D, but the present disclosure is not limited thereto. The peripheral region 220A, the peripheral region 220B, the peripheral region 220C and the peripheral region 220D, for example, may be located at the sides of the substrate 201, respectively. The term "located at the sides of the substrate 201" may refer to the arrangement that the peripheral region 220A, the peripheral region 220B, the peripheral region 220C and the peripheral region 220D are respectively adjacent to a side S of the substrate 201, or one side of each peripheral region 220A, peripheral region 220B, peripheral region 220C and peripheral region 220D is substantially align with the side S of the substrate 201, but the present disclosure is not limited thereto. In some embodiments, the second sub-seed layer 220 may be connected to the electrode plates for the electroplating during the electroplating process.

According to some embodiments of the present disclosure, each main region may be connected to at least one protrusion, for example, one or more protrusions may extend outwardly from a main region. According to some embodiments of the present disclosure, each side of the main region may include at least one protrusion, for example, each side may include one or more protrusions. FIG. 3 shows that the main region 210A includes an example of a protrusion 210A-1, a protrusion 210A-2, a protrusion 210A-3, a protrusion 210A-4, a protrusion 210A-5, a protrusion 210A-6, a protrusion 210A-7 and a protrusions 210A-8; the main region 210B includes an example of a protrusion 210B-1, a protrusion 210B-2, a protrusion 210B-3, a protrusion 210B-4, a protrusion 210B-5, a protrusion 210B-6, a protrusion 210B-7 and a protrusion 210B-8, but the present disclosure is not limited thereto. According to some embodiments of the present disclosure, at least one of the multiple protrusions may have a chamfer, for example, one protrusion may independently have a chamfer with an angle $\theta$. The angle $\theta$ of a protrusion may be between 30° to 150° (30°≤$\theta$≤150°), for example, the angle $\theta$ may be between 45° to 135° (45°≤$\theta$≤135°), or the angle $\theta$ may be between 60° and 120° (60°≤$\theta$≤120°), or the angle $\theta$ may be between 80° and 100° (80°≤$\theta$≤100°), but the present disclosure is not limited thereto. For example, the angle $\theta$ may be detected by an auto-optical inspection (AOI). When the angle $\theta$ is greater than or equal to 30° and less than 1500, it helps to reduce the current density of the seed layer, which may improve the unevenness of the electric field caused by the unevenness of the peripheral electric lines of force of the substrate 201, to be beneficial to improve the uniformity of the thickness of the electroplating layer (for example, the electroplated copper layer) thereon, so it is beneficial to improve the electrical reliability of the electronic device 100. In some embodiments, one or more protrusions may also have a round shape. For example, please refer to FIG. 3A. For example, from a top view, one or more protrusion 210A-1, protrusion 210A-2, protrusion 210A-3, protrusion 210A-4, protrusion 210A-5, protrusion 210A-6, protrusion 210A-7, protrusion 210A-8, protrusion 210B-1, protrusion 210B-2, protrusions 210B-3, protrusion 210B-4, protrusion 210B-5, protrusion 210B-6, protrusion 210B-7, and protrusion 210B-8 may respectively include different embodiments of an arc-shaped edge/corner or of a rounded corner, etc., but the present disclosure is not limited thereto. When a protrusion has a round shape, it is also helpful to improve the unevenness of the electric field caused by the unevenness of the peripheral electric lines of force of the substrate 201, it is helpful to improve the uniformity of the thickness of the electroplating layer, it is beneficial to improve the uniformity of the thickness of the electroplating layer, so it is beneficial to improve the electrical reliability of the electronic device 100. In some embodiments, the shape of one or more protrusions may or may not be the same as the shape of another protrusion.

From a top view, there may be a gap disposed between adjacent protrusions, which means the shortest distance disposed between two adjacent extending edges of two adjacent protrusions on the same side of the substrate 201 along the X direction or along the Y direction. According to some embodiments of the present disclosure, the gap between adjacent protrusions may be variable and optionally designed as needed, for example, may be identical, not identical, or not the same at all. For example, there is a gap P1 between the adjacent two extending sides of the adjacent protrusions 210A-1 and 210A-2 along the X direction or the Y direction, and there is a gap P2 between two adjacent extending sides of the adjacent protrusions 210A-3 and 210A-4 along the X direction or the Y direction, and the length of the gap P1 may be the same as or different from the length of the gap P2. FIG. 3 illustrates an embodiment in which the length of the gap P1 and the length of the gap P2 are different (P1 #P2), but the present disclosure is not limited thereto. Different gaps which are designed between the protrusions may reduce the concentration of current density at the corners and improve the problem of the uneven thickness of the electroplating layer.

According to some embodiments of the present disclosure, a plurality of conductive lines 230 may be disposed between the first sub-seed layer 210 and the second sub-seed layer 220, for example, may be disposed between a plurality of protrusions of the first sub-seed layer 210 and the second sub-seed layer 220 to serve as an electrical connection conductive lines between the first sub-seed layer 210 and the second sub-seed layer 220, that is to say, one of the protrusions may be electrically connected to the second sub-seed layer 220 through the at least one of the conductive lines 230. That is to say, one of the protrusions may be electrically connected to one of the peripheral regions of the second sub-seed layer 220 through the at least one of the conductive lines 230. That is to say, the first sub-seed layer 210 may be electrically connected to one of the peripheral regions of the second sub-seed layer 220 through the at least one of the conductive lines 230. According to some embodiments of the present disclosure, a conductive line 230 may have at least one turn. The conductive line 230 having a turn helps to reduce the difference in the respective lengths of different conductive lines at different positions. According to some embodiments of the present disclosure, the difference in length between the conductive lines 230 at different positions may be not greater than 15%, or the difference in length between the conductive lines 230 at different positions may be not greater than 10%, or the difference in length between the conductive lines 230 at different positions may be not greater than 5%. For example, the difference in length between the length M of the longest conductive line and the length m of the shortest conductive line which are connected to the same main region may be not greater than 15%, that is, $0 \leq (M-m)/M \leq 0.15$, or the difference in length between the length M of the longest conductive line and the length m of the shortest conductive line which are connected to the same main region may be not greater than 10%, that is to say $0 \leq (M-m)/M \leq 0.10$, or the difference in length between the length M of the longest conductive line and the length m of the shortest conductive line which are connected to the same main region may be not greater than 5%, that is, $0 \leq (M-m)/M \leq 0.05$. The calculation method of the length of the conductive line 230 may be the sum of all the lengths of a given conductive line from the first sub-seed layer 210 to the second sub-seed layer 220 along the X direction or the Y direction. FIG. 3 illustrates the conductive line 230L-1, the conductive line 230L-2, the conductive line 230L-3, the conductive line 230L-4, the conductive line 230L-5, the conductive line 230L-6, the conductive line 230L-7 and the conductive line 230L-8 connected to the main region 210A, and the conductive line 230D-1, the conductive line 230D-2, the conductive line 230D-3, the conductive line 230D-4, the conductive line 230D-5, the conductive line 230D-6, the conductive line 230D-7 and the conductive line 230D-8 connected to the main region 210B, but the present disclosure is not limited thereto. For example, the conductive line 230L-1 may include an embodiment of the turn 210L-1A and the turn 210L-1B, but the present disclosure is not limited thereto. By means of the above design, it is possible to reduce the difference in the paths of different currents provided by the electrode plate to the main region, thereby improving the thickness uniformity of the electroplating layer or reducing the curvature of the substrate.

In some embodiments, a blank region, such as but not limited to a blank region 220e, a blank region 220f, a blank region 220g and a blank region 220h, may be arranged between a plurality of adjacent peripheral regions, such as adjacent peripheral region 220A, peripheral region 220B, peripheral region 220C or peripheral region 220D. A blank region may refer to a region on the substrate 201 where the patterned seed layer 203' is not provided, or it may also be regarded as that there are a blank region and the patterned seed layer 203' on the substrate 201, but the present disclosure is not limited thereto. For example, in some embodiments, a blank region may be disposed at a corner of the substrate 201 or between adjacent peripheral regions, but the present disclosure is not limited thereto. The shape of the blank region may be determined according to the shape of the substrate 201 or to the shape of the peripheral region. For example, the shape of the blank region may be a polygon, but the present disclosure is not limited thereto. The design of the blank region may reduce the unevenness of the thickness of the electroplating layer caused by the concentration of the current density at the corners, and help to maintain the electrical reliability of the electronic device.

According to some embodiments of the present disclosure, the patterned seed layer 203' may further include one or more third sub-seed layers 235. In some embodiments, the third sub-seed layers 235 may be disposed between adjacent first sub-seed layers, for example, one or more third sub-seed layers 235 may be disposed between two adjacent main regions of a plurality of main regions. The shape of the third sub-seed layer 235 may include various embodiments such as a polygon, an arc-shaped edge, or a rounded corner, but the present disclosure is not limited thereto. For example, as shown in FIG. 3B, the third sub-seed layer 235 may be disposed between two adjacent main regions of the first sub-seed layer 210, such as between the main region 210A and the main region 210B shown in FIG. 3B, but the present disclosure is not limited thereto. According to some embodiments of the present disclosure, the third sub-seed layer 235 may be connected to at least one of a plurality of conductive lines. According to some embodiments of the present disclosure, the first sub-seed layer 210 may be electrically connected to the third sub-seed layer 235 through at least one of a plurality of conductive lines, such as the protrusion 210A-8 of the first sub-seed layer may be electrically connected to the third sub-seed layer 235 through the conductive line 230L-8. That is to said, the first sub-seed layer 210 may be electrically connected to the second sub-seed layer 220 through the third sub-seed layer 235 and the at least one of a plurality of conductive lines. According to some embodiments, the third sub-seed layer 235 may be, for example, a current transfer portion. According to some embodiments of the present disclosure, the third sub-seed layer 235 may be electrically connected to the second sub-seed layer 220 through at least one of a plurality of conductive lines, for example, the third sub-seed layer 235 may be electrically connected to the second sub-seed layer 220A through the conductive line 230D-3. The calculation method of the length of the conductive lines in the presence of the third sub-seed layer 235 may be the sum of all the lengths of a given conductive line from the first sub-seed layer 210 to the second sub-seed layer 220 via passing through the third sub-seed layer 235 along the direction parallel to the X direction or the Y direction. For example, please refer to FIG. 3B, the length calculation of the conductive line 230L-8 may be regarded as the sum of the length L1+the length L2+the length L3+the length L4 (L1+L2+L3+L4), but the present disclosure is not limited thereto. The addition of the third sub-seed layer 235 may reduce the chance that any conductive line is broken near a turn to affect the electrical reliability of the electronic device 100. In detail, without the third sub-seed layer 235, the line segment of the conductive line 230L-8 corresponding to the length L4 and the line segment corresponding to the length L3 may have a 90-degree angle at the turn, and the line width at the turn is the line width of the conductive line, which is very fine; and the location of the third sub-seed layer 235 in FIG. 3B is set to overlap the pre-determined location of the turn to replace the turn of the conductive line of an originally fine line width with a block of the third sub-seed layer 235 of a larger area to improve the problem of disconnection. Since the first sub-seed layer 210 may be electrically connected to the second sub-seed layer 230 through a conductive line 230, and the conductive line 230 may first pass through the third sub-seed layer 235, or the third sub-seed layer 235 may overlap a portion of the conductive line 230 (for example, the conductive lines 230L-8). Therefore, in some embodiments, the first sub-seed layer 210 may also be regarded as electrically connected to the second sub-seed layer 230 by passing through the conductive line 230 and the third sub-seed layer 235.

Figure 4:
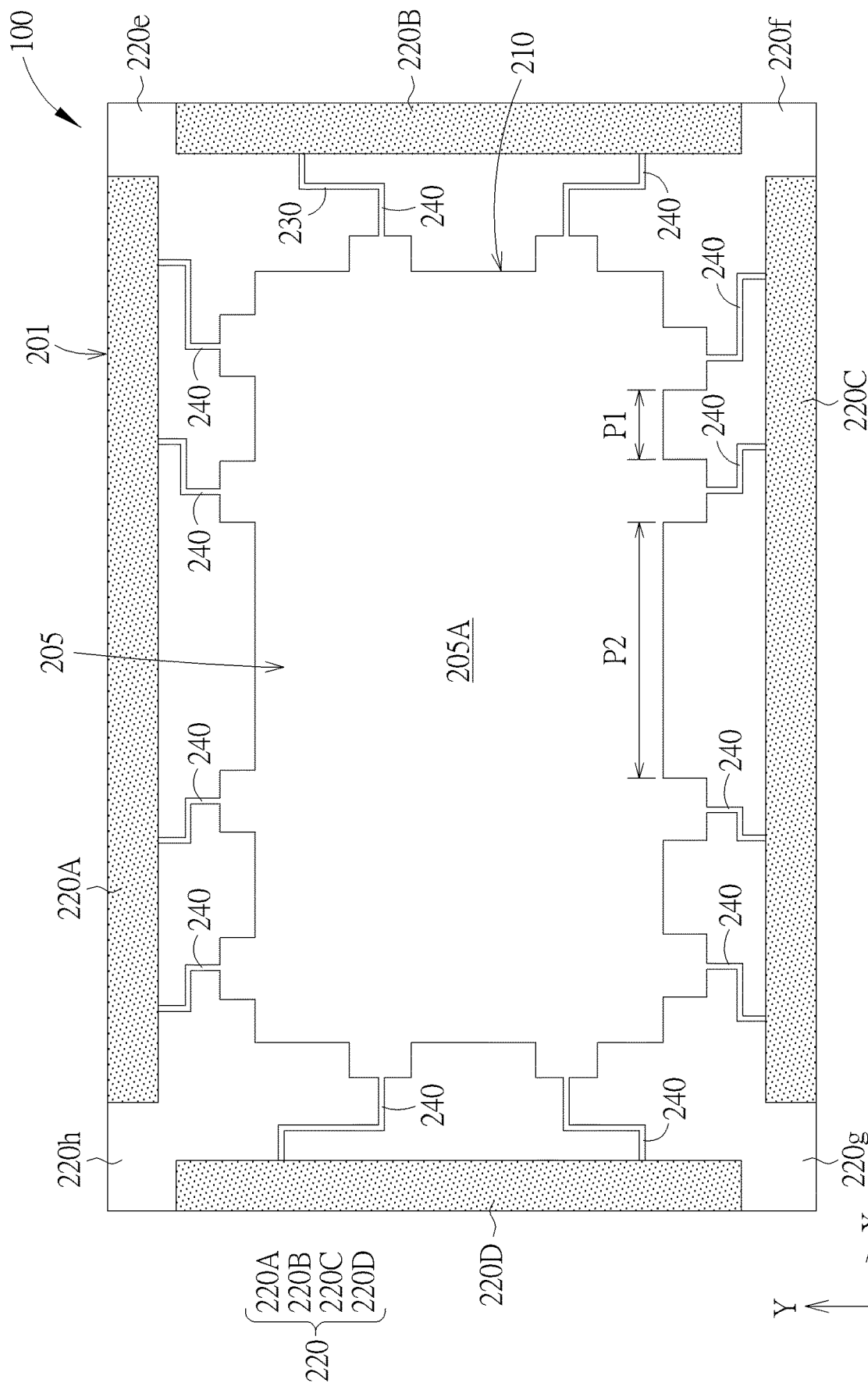
FIG. 4 and FIG. 4A are schematic top views corresponding to the substrate and to film layers atop it of FIG. 2B according to a method for manufacturing an electronic device of the present disclosure.
Figure 4A:
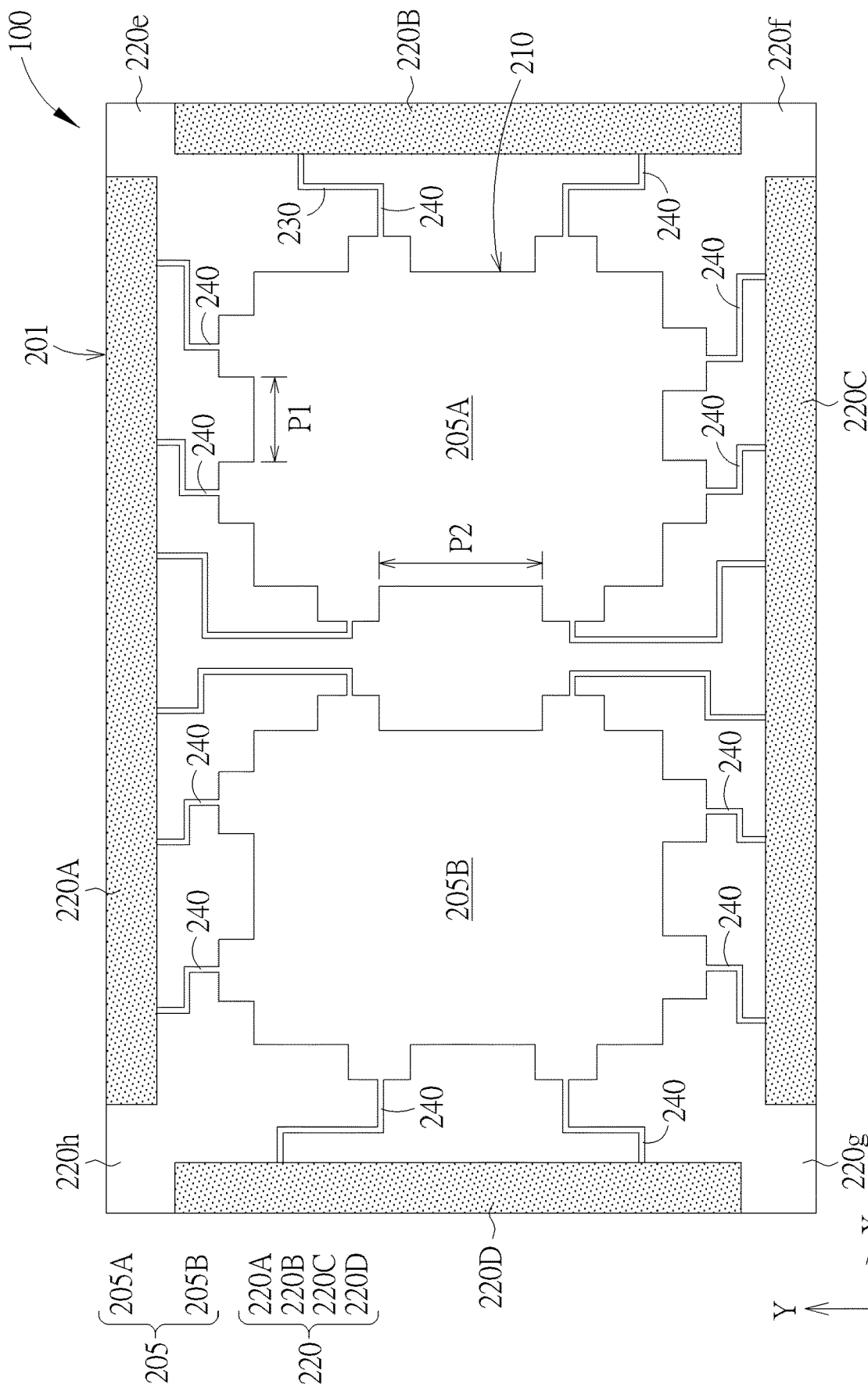

FIG. 2B is a schematic cross-sectional view of the substrate 201 corresponding to step 140 of FIG. 1 according to the method for manufacturing the electronic device 100 of the present disclosure. FIG. 4 and FIG. 4A are schematic top views corresponding to the substrate 201 and to film layers atop it of FIG. 2B. Step 140 in FIG. 1 corresponds to what is shown in FIG. 2B, and the metal layer 205 may be formed in the presence of the patterned seed layer 203'. For example, the metal layer 205 may be formed on at least one of a plurality of sub-seed layers by an electroplating step, so that the metal layer 205 may cover the patterned seed layer 203'. In some embodiments, the metal layer 205 may be selectively formed on one or more of the first sub-seed layers 210 so that the metal layer 205 may cover one or more first sub-seed layers 210 and/or one or more third sub-seed layers (not shown). In some embodiments, the metal layer 205 may be further formed on a plurality of conductive lines 230 to form a plurality of traces 240. Or in some embodiments, the metal layer 205 is formed without covering the second sub-seed layer 220, so that from a top view, the substrate 201 includes the metal layer 205 covering the first sub-seed layer 210 and the patterned seed layer 203' exposing the second sub-seed layer 220. The patterned seed layer 203' may also expose a part of the release layer 202.

According to some embodiments of the present disclosure, from a top view, the metal layer 205 may include at least one main region, for example, may include one or more main regions. FIG. 4 illustrates an embodiment according to the electronic device 100 of the present disclosure in which the metal layer 205 includes a main region 205A. FIG. 4A illustrates another embodiment according to the electronic device 100 of the present disclosure in which the metal layer 205 includes a main region 205A and a main region 205B, but the metal layer 205 of the present disclosure is not limited to two main regions, and may include embodiments with more than two main regions. The main region 205A or the main region 205B may be respectively electrically connected to the peripheral regions of one or more second sub-seed layers 220 through a plurality of traces 240.

FIG. 2C is a schematic cross-sectional view of the substrate 201 corresponding to step 150 of FIG. 1 according to the method for manufacturing the electronic device 100 of the present disclosure. Step 150 in FIG. 1 corresponds to what is shown in FIG. 2C, the step of patterning the metal layer 205 may be carried out to obtain a patterned metal layer, and this step may simultaneously pattern the seed layer 203'. In some embodiments, one or more etching steps may be carried out to pattern metal layer 205 and patterned seed layer 203'. For example, the metal layer 205 may be patterned first, and then the first sub-seed layer (for example, the seed layer 203' in FIG. 2C) located under the patterned metal layer 205' may be conformally patterned in the presence of the patterned metal layer 205', to complete one or more etching steps, but the present disclosure is not limited thereto. In some embodiments, an electroplating photoresist may be provided on the seed layer 203' to define the region where the metal layer 205 is formed. After the metal layer 205 is formed, the electroplating photoresist may be removed to obtain a patterned metal layer 205'. The metal layer 205' may expose a portion of the seed layer 203', and then the exposed seed layer 203' may be removed after one or more etching steps are completed. In some embodiments, the completed patterned metal layer 205' and the second patterned seed layer 203' after the second patterning may together be used as the first redistribution layer 250 (RDL), for example, may be used as a pad for the under bump metallization (UBM), but the present disclosure is not limited thereto. According to the present disclosure, a redistribution layer may include a stacking layer formed by alternately stacking multiple layers of metal layers, seed layers and insulating layers (not shown), for example insulating layers (not shown) and patterned metal layers may together form a functional stack. The redistribution layer may optionally further include electronic components such as a thin film transistor, an electrostatic discharge (ESD) device, or a capacitor, but the present disclosure is not limited thereto.

FIG. 2C is a schematic cross-sectional view of the substrate 201 corresponding to step 160 of FIG. 1 according to the method for manufacturing the electronic device 100 of the present disclosure. The step 160 in FIG. 1 corresponds to what is shown in FIG. 2C, and the step for forming an optional insulating layer 260 may be carried out. In some embodiments, an insulating layer 260 may be formed on the patterned metal layer 205' so that the insulating layer 260 may cover the patterned metal layer 205' and the first sub-seed layer (for example, the seed layer 203' in FIG. 2C) to serve as a protective layer. Alternatively, in some embodiments, an insulating layer 260 may be formed between release layer 202 and seed layer 203. The insulating layer 260 may cover the patterned metal layer 205' and the seed layer 203', to reduce the possibility of moisture or oxygen affecting the patterned metal layer 205' and the seed layer 203', so it is beneficial to improve the electrical reliability of the electronic device 100. In some embodiments, the insulating layer 260 may include a dielectric material, such as an organic insulating material, an inorganic insulating material, filler, or any suitable dielectric material. For example, the insulating layer 260 may include polyimide (PI), polystyrene (PS), a silicon oxynitride material, an ABF film (Ajinomoto build-up film), etc., but the present disclosure is not limited thereto. In some embodiments, the insulating layer 260 may be formed by using slit coating, but the present disclosure is not limited thereto. In some embodiments, the step of forming the insulating layer 260 may further include a process of patterning the insulating layer 260, so that the patterned insulating layer 260 is beneficial to go with the subsequent steps. The patterned metal layer 205', the seed layer 203' and the insulating layer 260 in the first redistribution layer 250 may together form a functional stack.

FIG. 2D is a schematic cross-sectional view of the substrate 201 corresponding to step 170 of FIG. 1 according to the method for manufacturing the electronic device 100 of the present disclosure. Step 170 in FIG. 1 corresponds to what is shown in FIG. 2D, and step for forming another group of a seed layer 271 and a metal layer 272 may be carried out. In some embodiments, another group of the seed layer 271 and the metal layer 272 may be used together to serve as a second redistribution layer 270, but the present disclosure is not limited thereto. The second redistribution layer 270 may pass through the opening 261 formed by the patterned insulating layer 260 which covers the patterned metal layer 205' and the first sub-seed layer (not shown) of the seed layer 203', and is electrically connected to the first redistribution layer 250 through the opening 261. For example, the seed layer 271 of the second redistribution layer 270 may be electrically connected to the patterned metal layer 205' of the first redistribution layer 250 so that the second redistribution layer 270 may be electrically connected to the first redistribution layer 250. Please refer to the above for the materials or forming methods of the seed layer 271 and the metal layer 272 of the second redistribution layer 270, so the details are not elaborated again.

FIG. 2E is a schematic cross-sectional view of the substrate 201 corresponding to step 180 of FIG. 1 according to the method for manufacturing the electronic device 100 of the present disclosure. Step 180 in FIG. 1 corresponds to what is shown in FIG. 2E, and the steps for removing the substrate 201 and the release layer 202, for forming the bonding material 280, and for electrically connecting to the chip 290 may be carried out. For example, the substrate 201 may be removed by separating the temporary substrate 201 from the first redistribution layer 250 with the help of the release layer 202. In some embodiments, a bonding material 280 may be formed in electrical connection with the first redistribution layer 250, for example, a first bonding material 281 may be formed to be electrically connected to the patterned seed layer 203' (shown in FIG. 2D) of the first redistribution layer 250. In some embodiments, the bonding material 280 may be formed in electrical connection with the second redistribution layer 270, for example, the second bonding material 282 may be formed to be electrically connected to the metal layer 272 of the second redistribution layer 270. In some embodiments, the chip 290 may be further electrically connected to the second bonding material 282, so that the chip 290 may be electrically connected to the first bonding material 281 through the mutually electrically connected second bonding material 282, the second redistribution layer 270 and the first redistribution Layer 250. The bonding material 280 may include a conductive material, for example, may include a conductive bump, a solder ball, a combination of the above, or other suitable materials, but the present disclosure is not limited thereto. The chip 290 may include an electronic component, for example, may include a diode, a semiconductor die, but the present disclosure is not limited thereto. In some embodiments, before the chip 290 is bonded to the second redistribution layer 270, a dicing process may be selectively carried out, so as to cut the entire second redistribution layer 270 and first redistribution layer 250 shown in FIG. 2D into pieces so that each piece may correspond to the pre-bonded chip 290, but the present disclosure is not limited thereto. After the chip 290 is bonded to the RDL, a first protective layer 291 and a second protective layer 292 may be formed. The first protective layer 291 may be formed between the chip 290, the redistribution layer 270 and the bonding material to improve the reliability of the electronic device. The first protective layer 291 may be, for example, an underfill or other suitable materials, but the present disclosure is not limited thereto. The second protective layer 292 may surround the chip 290 or the redistribution layer 270 or the redistribution layer 250. The second protective layer 292 may reduce the influence of moisture and oxygen in the environment on the electronic device 100. The second protective layer may be, for example, an epoxy molding compound (EMC) or other suitable materials, but the present disclosure is not limited thereto.

It should be noted that, in the method for manufacturing the electronic device 100 of the present disclosure as shown in FIG. 1, steps 150 to 180 may be optional, in other words, these steps may be partially or completely omitted in some embodiments. For example, in some embodiments, the method for manufacturing an electronic device of the present disclosure may include the steps 110 to 160 as well as the step 180, and the step 170 is omitted, but the present disclosure is not limited thereto.

According to some embodiments of the present disclosure, the present disclosure provides a method for manufacturing an electronic device. By firstly forming a patterned partitioned seed layer, a patterned metal layer is conformally formed on the patterned partitioned seed layer to go with the design of the blank region, the curvature of the conductive layer caused by the uneven current density or by the uneven electric field at the edges or at the corners may be reduced, and it may help maintain the electrical reliability of the electronic device. In some embodiments, the protrusions of the main region may have an appropriate angle θ or a shape, which helps to reduce the current density of the seed layer, to improve the uneven electric field caused by the uneven peripheral electric lines of force of the substrate, and it is beneficial to improve the uniformity of the thickness of the electroplated copper layer, so it is beneficial to improve the electrical reliability of the electronic device. Optionally, after a metal layer is formed on the patterned partitioned seed layer by an electroplating process, a patterning process may be carried out on the metal layer, and the underlying partitioned seed layer may also be patterned accordingly. Therefore, the seed layer may go through two patterning processes.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A method for manufacturing an electronic device, comprising:
   providing a substrate;
   forming a seed layer on the substrate;
   patterning the seed layer to form a plurality of sub-seed layers and a plurality of conductive lines, wherein each of the conductive lines has at least one turn; and
   forming a metal layer on at least one of the sub-seed layers after patterning the seed layer,
   wherein, the sub-seed layers comprise a first sub-seed layer and a second sub-seed layer surrounds the first sub-seed layer, the first sub-seed layer comprises a plurality of main regions, the second sub-seed layer comprises a plurality of peripheral regions, one of the plurality of main regions is disposed between two of the plurality of peripheral regions, two of the plurality of conductive lines is disposed between the one of the main regions and one of the two of the plurality of peripheral regions, the one of the main regions and one of the two of the plurality of peripheral regions is connected by the two of the plurality of conductive lines, and the one of the main regions of the first sub-seed layer and the two of the plurality of peripheral regions of the second sub-seed layer are separated from each other, wherein a length difference between the two of the plurality of conductive lines is not greater than 15%.

2. The method for manufacturing the electronic device of claim 1, wherein the metal layer is formed on the conductive lines to become traces.

3. The method for manufacturing the electronic device of claim 1, wherein the metal layer is formed on the first sub-seed layer.

4. The method for manufacturing the electronic device of claim 1, wherein the first sub-seed layer comprises a plurality of protrusions.

5. The method for manufacturing the electronic device of claim 4, wherein at least one of the protrusions has a chamfer.

6. The method for manufacturing the electronic device of claim 5, wherein the chamfer has an angle between 30° and 150°.

7. The method for manufacturing the electronic device of claim 4, wherein there is a gap disposed between any adjacent two of the protrusions.

8. The method for manufacturing the electronic device of claim 4, wherein one of the protrusions is electrically connected to the second sub-seed layer through one of the conductive lines.

9. The method for manufacturing the electronic device of claim 1, further comprising:
patterning the metal layer to obtain a patterned metal layer.

10. The method for manufacturing the electronic device of claim 9, wherein an insulating layer is formed on the patterned metal layer.

11. The method for manufacturing the electronic device of claim 10, further comprising:
patterning the insulating layer.

12. The method for manufacturing the electronic device of claim 11, wherein the insulating layer and the patterned metal layer together form a functional stack.

13. The method for manufacturing the electronic device of claim 1, wherein the seed layer which is patterned comprises a third sub-seed layer disposed between adjacent two of the main regions.

14. The method for manufacturing the electronic device of claim 13, wherein the third sub-seed layer is connected to at least one of the conductive lines.

15. The method for manufacturing the electronic device of claim 14, wherein the first sub-seed layer is electrically connected to the third sub-seed layer through the at least one of the conductive lines.

16. The method for manufacturing the electronic device of claim 14, wherein the third sub-seed layer is electrically connected to the second sub-seed layer through the at least one of the conductive lines.

* * * * *